(12) United States Patent
Robinson et al.

(10) Patent No.: US 11,746,255 B2
(45) Date of Patent: Sep. 5, 2023

(54) HARD-MASK COMPOSITION

(71) Applicants: Alex P. G. Robinson, Northfield Birmingham (GB); Guy Dawson, Bishops Tachbrook (GB); Alan G. Brown, Malvern (GB); Thomas Lada, Somerville, MA (US); John Roth, Cohasset, MA (US); Edward Jackson, Franklin, MA (US)

(72) Inventors: Alex P. G. Robinson, Northfield Birmingham (GB); Guy Dawson, Bishops Tachbrook (GB); Alan G. Brown, Malvern (GB); Thomas Lada, Somerville, MA (US); John Roth, Cohasset, MA (US); Edward Jackson, Franklin, MA (US)

(73) Assignee: IRRESISTIBLE MATERIALS LTD, Birmingham (GB)

( * ) Notice: Subject to any disclaimer, the term of this patent is extended or adjusted under 35 U.S.C. 154(b) by 0 days.

(21) Appl. No.: 15/904,420

(22) Filed: Feb. 25, 2018

(65) Prior Publication Data

US 2019/0127604 A1    May 2, 2019

Related U.S. Application Data

(63) Continuation-in-part of application No. 15/164,801, filed on May 25, 2016, now Pat. No. 10,438,808.

(51) Int. Cl.
*H01L 21/033* (2006.01)
*C08G 59/50* (2006.01)
*C09D 163/04* (2006.01)

(52) U.S. Cl.
CPC ....... *C09D 163/04* (2013.01); *C08G 59/5033* (2013.01); *H01L 21/0332* (2013.01)

(58) Field of Classification Search
CPC .................................................... C09D 163/04
See application file for complete search history.

(56) References Cited

U.S. PATENT DOCUMENTS

| 5,763,719 A * | 6/1998 | Gugel | C07C 13/32 423/445 B |
| 2012/0004476 A1* | 1/2012 | Yoon | B82Y 10/00 585/26 |
| 2012/0045900 A1* | 2/2012 | Watanabe | C07C 69/753 438/703 |
| 2014/0312281 A1* | 10/2014 | Jackson | H01L 51/0047 252/500 |
| 2015/0010703 A1* | 1/2015 | Frommhold | B05D 1/005 427/240 |
| 2015/0069304 A1* | 3/2015 | Blouin | C07C 43/215 252/500 |

* cited by examiner

*Primary Examiner* — Megan McCulley
(74) *Attorney, Agent, or Firm* — The Patent Practice of Szmand and Shelnut LLC; James G. Shelnut

(57) ABSTRACT

Disclosed and claimed herein is a composition for forming a spin-on hard-mask, having a fullerene derivative substituted with an amine and a crosslinking agent. The formulation is drain compatible with other solvents used in the semiconductor industry.

6 Claims, 2 Drawing Sheets

HARD-MASK COMPOSITION

REFERENCE TO PRIOR FILED APPLICATION

The present application is a continuation-in-part, and claims the benefit under 35 U.S.C. § 120, of U.S. patent application Ser. No. 15/164,801 filed on 25 May 2016, entitled "HARD-MASK COMPOSITION," which application is incorporated by reference herein in its entirety.

FIELD OF THE INVENTION

The present application for patent is in the field of imaging for semiconductor manufacturing and more specifically is in the field of etch masking using spin-on hard-mask formulations.

BACKGROUND

Minimum feature sizes of semiconductor devices continue to shrink to enable increasing device densities. One method of achieving such high density patterning is to use thin photoresist films to mitigate problems such pattern collapse of high aspect-ratio resist features upon development. One possible solution to the problem involves using a high-resolution, high sensitivity and high etch durability fullerene resist. However, even though the aspect ratios produced by such resists may be as high as 5:1, the overall etch depth is limited significantly by the usable resist thickness.

A multilayer hard-mask stack can allow a further increase of the aspect ratio of the etched image. Such methods may use a thick amorphous carbon, deposited in-vacuo by chemical vapor deposition, which is then coated with a thin-silicon rich layer. A thin photoresist film is then sufficient to pattern the silicon-rich layer; thus avoiding pattern collapse. The silicon-rich layer is in-turn used as a hard-mask to pattern the carbon, giving a high aspect ratio carbon pattern suitable for providing a mask for etching the silicon wafer. By alternating from silicon to carbon rich materials and vice versa optimization of the overall etch selectivities of various substrates can be accomplished.

In recent years, methanofullerene materials have been used in hard-mask formulations. For example, Frommhold et al., in International Patent Application No. WO1013/117908 A1, describe a hard-mask material comprising a methanofullerene and a cross-linker, However, there continues to be a need for hard mask formulations that do not form precipitates or residues in typical semiconductor waste streams, which contain solvents for other formulations such as photoresists, edge bead removers, strippers, organic developers and the like. This need is addressed by the materials described herein.

DETAILED DESCRIPTION

As used herein, the conjunction "and" is intended to be inclusive and the conjunction "or" is not intended to be exclusive unless otherwise indicated or required by context. For example, the phrase "or, alternatively" is intended to be exclusive. When used in the context of alternative chemical substituents on a molecule, the conjunction "or" is intended to be exclusive. As used, herein, the article "a" is understood to mean one or more. As used herein, the term "exemplary" is used to indicate an example and is not necessarily used to indicate preference. As used herein, the term "exohedral ring" is understood to be a ring structure fused to the outside of a fullerene at two adjacent carbon atoms. The number of members in the exohedral ring includes the two carbon atoms in the fullerene. As used herein a diluent is understood to be a weak solvent or a non solvent.

Figure 1:
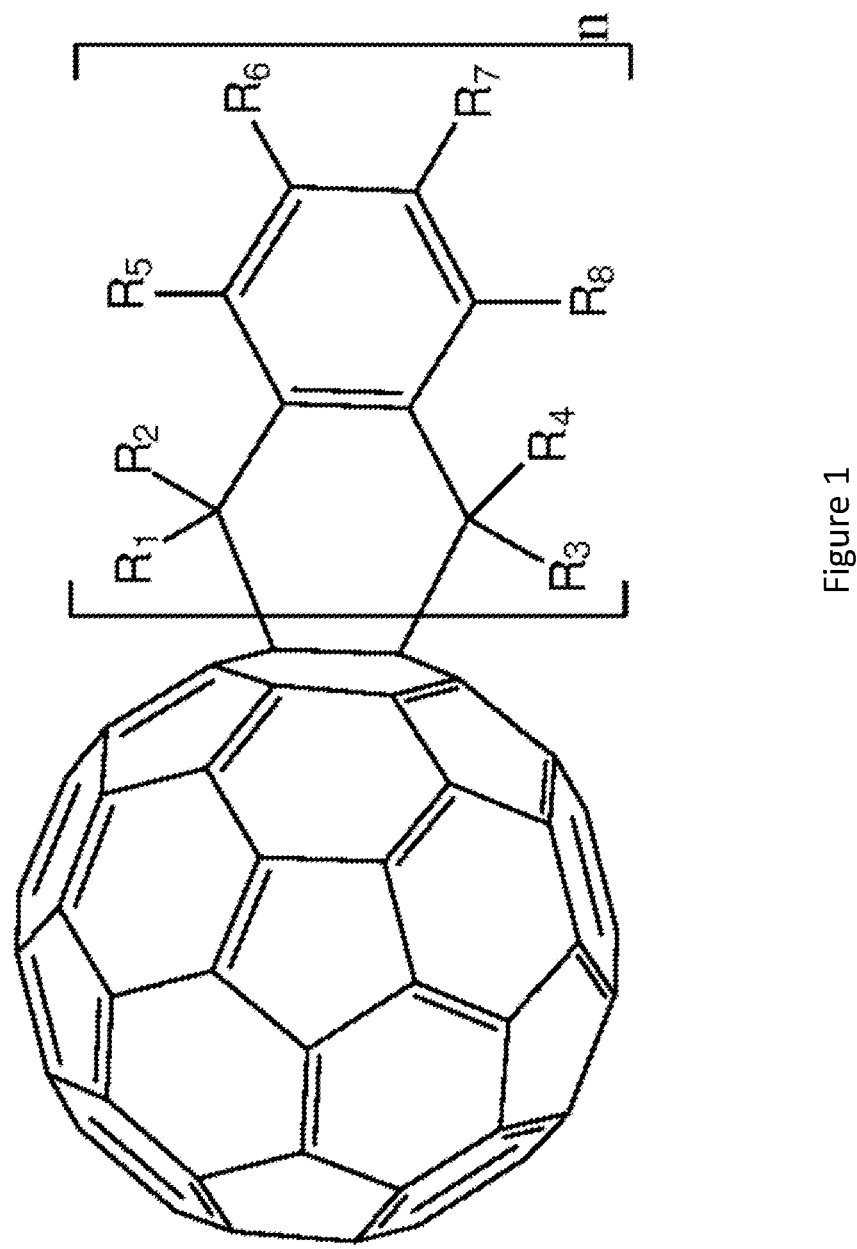
FIG. 1 shows the general structure of the fullerene [4+2] cycloaddition product.

We have found an unexpected advantage in fullerene hard mask materials in which the fullerene derivative comprises substituents that are [4+2] cycloaddition products or the equivalent (See FIG. 1), where $R_1$, $R_2$, $R_3$, $R_4$, $R_5$, $R_6$, $R_7$, and $R_8$ comprise at least one amine group and n is 1-12. In particular, such compounds remain in kinetically stable and possibly thermodynamically stable solutions when formulations containing them in solution encounter the solvents of other formulations. Accordingly, they are what are known in the semiconductor industry as "spin bowl compatible" because they do not appear to form precipitates or residues within the spin-coating bowl or the various drainage conduits when they encounter dissimilar solvents from other formulations such as photoresists, strippers, edge bead removers and the like.

Disclosed herein is a hard-mask composition, that includes: a first solute, said first solute comprising one or more fullerene derivatives having one or more exohedral rings, expressed by the general formula (II), a second solute comprising a crosslinking agent that comprises two or more thermally or catalytically reactive groups, and a first solvent. Referring to (II), n is the number of exohedral rings and is an integer from 1 to 12, Q, is a fullerene having 60, 70, 76, 78, 80, 82, 84, 86, 90, 92, 94, or 96 carbon atoms; and, for each exohedral ring, the substituents, $R_1$, $R_2$, $R_3$, $R_4$, $R_5$, $R_6$, $R_7$, and $R_8$ are independently, a hydrogen atom, an alkyl group having 1-20 carbon atoms, or an amine group, provided that at least one and no more than three of $R_1$, $R_2$, $R_3$, $R_4$, $R_5$, $R_6$, $R_7$, and $R_8$ are amine groups, and wherein, if n is 2-12, the exohedral rings may be the same or different.

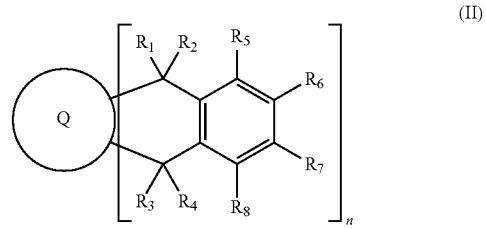

(II)

Further disclosed herein is a method of producing a low particulate waste stream in which a hard mask composition, described herein or a concentrate thereof, is provided to a waste stream. Further provided to the same waste stream is a fluid, comprising a second solvent or a diluent, such as a photoresist, a resist stripper or remover, an edge bead remover, an organic developer or the like, wherein the solvent or diluent in the fluid in the fluid may or may not be the same as that in the hard mask composition. As an example, solvent or the diluent in the fluid may comprise an alcohol, an amine, an ester, a lactone, an ether, an ether alcohol, an ether ester, an ester alcohol, a ketone, a ketoester, an aldehyde, a lactone, a lactam, an imide, or a sulfone. In addition, given need for equipment flexibility a hard mask composition may be used along with the non hard mask fluids is any sequence. Solvents for hardmask materials are described infra.

The amine group or groups may be primary, secondary, or tertiary amines having various substituents, including, for example, without limitation, hydrogen atoms, linear or branched alkyl groups having 1-20 carbon atoms, aromatic groups having 1-20 carbon atoms, or arylalkyl groups having 1-20 carbon atoms. The foregoing groups may comprise heteroatoms in place of carbon atoms such as those that may be found in groups III through VI, in rows 1-3 of the periodic chart. Primary amines have two hydrogen atoms bonded to the nitrogen atom, and secondary amines have one hydrogen atom.

In certain exemplary compositions, $R_1$, $R_2$, $R_3$, or $R_4$ comprise alkyl groups as described supra. In certain other exemplary compositions, $R_1$, $R_2$, $R_3$, or $R_4$ comprise hydrogen atoms. In certain other exemplary compositions, $R_1$, $R_2$, $R_3$, or $R_4$ comprise hydrogen atoms and alkyl groups as described supra. In certain other exemplary compositions, $R_1$, $R_2$, $R_3$, or $R_4$ may comprise a primary, secondary or tertiary amine.

In certain exemplary compositions, $R_5$, $R_6$, $R_7$, or $R_8$ comprise alkyl groups as described supra. In certain other exemplary compositions, $R_5$, $R_6$, $R_7$, or $R_8$ comprise hydrogen atoms. In certain other exemplary compositions, $R_5$, $R_6$, $R_7$, or $R_8$ comprise hydrogen atoms and alkyl groups as described supra. In certain other exemplary compositions, $R_5$, $R_6$, $R_7$, or $R_8$ may comprise a primary, secondary or tertiary amine. In certain other exemplary compositions, $R_5$, or $R_8$ are alternative sites, wherein one alternative site comprises a primary, secondary or tertiary amine the other alternative site comprises a hydrogen atom or an alkyl group. In certain other exemplary compositions, $R_6$, or $R_7$ are alternative sites, wherein one alternative site comprises a primary, secondary or tertiary amine the other alternative site comprises a hydrogen atom or an alkyl group.

Chemical reactions to produce compounds such as those described herein may produce products that are inherently disordered. For example, a fullerene having two exohedral rings, each having a single amine group at alternative position $R_6$, as drawn in (II), may be attached to the fullerene such that positions $R_6$ and $R_7$ are switched or oriented the same way. Without intending to be bound by theory, this disorder may be a contributing factor in the observed solvent compatibility.

It is contemplated that the disclosed compositions and processes may advantageously be used in any reasonable combination. For example, a formulation having an epoxy resin might also contain an aminoplast crosslinker such as a methylolmethyl glycoluril resin or a methylolmethyl melamine resin.

In addition, a given formulation can contain a distribution of substitutions and substitution patterns on a fullerene without departing from the intended scope of the claims. Moreover, a given formulation can comprise a distribution of substitutions and substitution patterns on fullerenes having different numbers of carbon atoms, without departing from the intended scope of the claims. For example, a formulation may comprise various fullerene allotropes, such as $C_{60}$, $C_{70}$, $C_{76}$, $C_{78}$, $C_{84}$, $C_{86}$, $C_{90}$, $C_{92}$, $C_{94}$, $C_{96}$, and $C_{98}$, each of which may be substituted with 0 to 12 exohedral rings. As another example a formulation may comprise a variety of exohedrally substituted and unsubstituted fullerene allotropes, wherein the fullerenes before substitution are $C_{60}$, $C_{70}$, $C_{76}$, $C_{78}$, $C_{84}$, $C_{86}$, $C_{90}$, $C_{92}$, $C_{94}$, and $C_{96}$, and at least some of the fullerene, allotropes are substituted with 0 to 6 exohedral ring substituents. As another example a formulation may comprise a variety of exohedrally substituted and unsubstituted fullerene allotropes, wherein the fullerenes before substitution are $C_{60}$, and $C_{70}$, and at least some of the fullerene allotropes are substituted with 1 to 20 exohedral ring substituents and some of the fullerene allotropes are unsubstituted.

Figure 2:
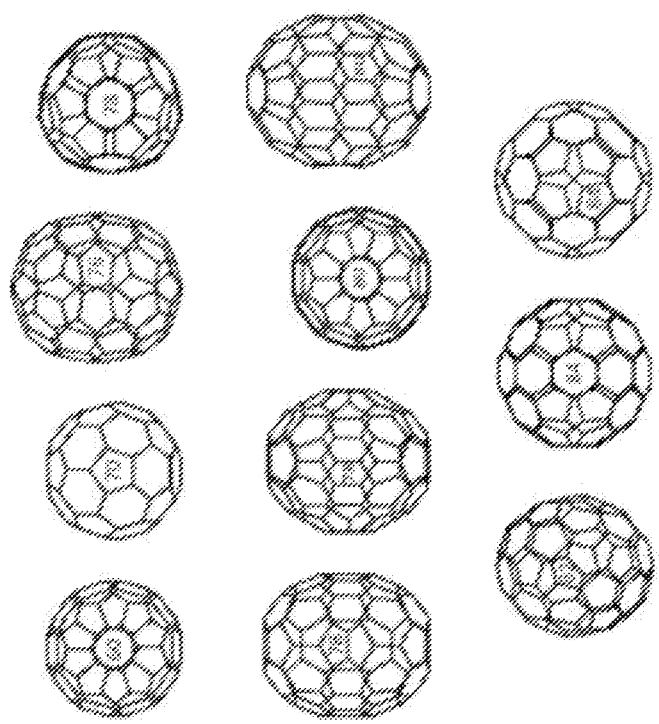
FIG. 2 shows, without limitation, representations of the different allotropes of the fullerene useful for the current disclosure.

The general formula (II) is a representation of substituted or unsubstituted fullerene derivatives (as the case may be) having 1-12 substituent groups when substituted. Fullerenes can have different allotropes, including, without limitation, $C_{20}$, $C_{25}$, $C_{36}$, $C_{50}$, $C_{60}$, $C_{70}$, $C_{76}$, $C_{78}$, $C_{80}$, $C_{82}$, $C_{84}$, $C_{86}$, $C_{90}$, $C_{92}$, $C_{94}$, $C_{96}$, and $C_{98}$, some of which are shown in (See Fig. 2), indicating the cage structure but not the bonding. In some cases, different allotropes may have the same number of carbon atoms; For closed structures Euler's polyhedron formula applies, $V-E+F=2$, where V, E, F are the numbers of vertices (carbon atoms), edges, and faces). If there are 12 pentagons in a fullerene, it follows that there are $V/2-10$ hexagons. It is understood that fullerene derivatives include all fullerene allotropes having the exohedral substituents described herein.

Cycloaddition reactions usually occur as the addition of one unsaturated entity to another to give a cyclic product in which, in most cases, all atoms are conserved in the final product. The two (or more) entities may reside on a single molecule or on multiple molecules. Without intending to be bound by theory, it is believed that the addition reaction can be explained by assuming that the flow of electron density takes place from the highest occupied molecular orbital (HOMO) of one entity to the lowest unoccupied molecular orbital (LUMO) of the other entity.

In accordance with the subject matter disclosed herein, fullerenes may be substituted via cycloaddition reactions across double bonds by a diene or analogous group to form a ling structure that utilizes two or more atoms on the fullerene. For example, in one embodiment, a diene or a hetero-analog thereof can add across a double bond on the fullerene via a cycloaddition reaction, to form a bridge across a pair of vertices wherein two 6-membered rings meet to form a so-called [6, 6] bridge in another embodiment, [6, 5] substitution in the vertices between a 6-membered-ring and a 5-membered-ring by the diene group or diene precursor group may occur. Synthesis techniques for cycloadditions of this kind may be found in Hirsch, et al., "Fullerenes: Chemistry and Reactions," WILEY-VCH Verlag GmbH and Co., Weinheim, Chapter 4, (2005), Diederich et al., Science, 271, 317, (1996), Filippone et al., "Exohedral Fullerenes," Encyclopedia of Polymeric Nanomaterials, Springer-Verlag, Berlin, Heidelberg, pp. 1-16, (2014), and Yang et al., J. Org. Chem., 78, 1163, (2013).

In addition to single elimination reactions, double or multiple elimination reactions may be used to generate a stable or transient diene. For example, a variety of 1,2-bis (halomethyl) compounds such as 1,2-bis(bromomethyl) benzene, substituted 1,2-bis(bromomethyl) benzene, and the like may form dienes in situ, by reacting with KI and a phase transfer catalyst, followed by single or multiple Diels Alder reactions with fullerenes, usually on [6,6] sides but possibly at [6,5] edges. Fullerenes of different carbon atom number undergo similar reactions. Phase transfer catalysts such as crown ethers, for example, 1,4,7,10,13,16-hexaoxacyclooctadecane (18 Crown-6), or quaternary ammonium salts, for example, $(bu)_4NI$ may be used to promote the reaction. Such reactions are described in Taylor, "Lecture Notes On Fullerene Chemistry: A Handbook For Chemists," Imperial College Press, London, pp. 177 ff., (1999) and Langa, et al., "Fullerenes: Principles and Applications," RSCPublishing, Cambridge, pp. 21 ff., (2007). In addition to substituted halogens, there may be an advantage to using one or more of the other leaving groups described above. Using such techniques, one may form m,m+1-dimethylene-m,m+1-dihydro-W aromatic and heteroaromatic compounds, where m denotes the location of a methylene group. Examples of W include, without limitation, benzene, naphthalene, thiophene, pyrrole (1H, and 2H), pyrazole, triazole, thiadiazole, oxadiazole, imidazole, pyridine, and the like. Exemplary dienes which may be formed in this way include without limitation, 2,3-dimethylene-2,3-dihydrobenzene, 2,3-dimethylene-2,3-dihydronaphthalene, 2,3-dimethylene-2,3-dihydrophenanthrene, 2,3-dimethylene-2,3-dihydropyridine, and the like.

Other reaction schemes may be useful in forming useful dienes. For example, 1,4-dihydrophthalazine may used to form 2,3-dimethylene-2,3-dihydrobenzene by thermally eliminating $N_2$. Other examples of diene precursors include, without limitation, 1,3-dihydro-2-benzothiophene 2,2-dioxide, 1,4-dihydro-2,3-benzoxathiine 3-oxide. The latter two precursors form 2,3-dimethylene-2,3-dihydrobenzene by eliminating $SO_2$ as a gas or nascent gas. Exemplary dienes which may be formed in this way include without limitation, 2,3-dimethylene-2,3-dihydrobenzene, 2,3-dimethylene-2,3-dihydronaphthalene, 2,3-dimethylene-2,3-dihydrophenanthrene, 2,3-dimethylene-2,3-dihydropyridine, and the like. Such reactions are described in Chung, et al., J. Chem. Soc., Chem Commun., (1995), 2537, and Beer, et al., J. Mater. Chem., (1997), 7, 1327. Using such techniques, one may form m,m+1-dimethylene-m,m+1-dihydro-W aromatic and heteroaromatic compounds, where m denotes the location of a methylene group. Examples of W include, without limitation, benzene, naphthalene, thiophene, pyrrole (1H, and 2H), pyrazole, triazole, thiadiazole, oxadiazole, imidazole, pyridine, and the like. Exemplary dienes which may be formed in this way include without limitation, 2,3-dimethylene-2,3-dihydrobenzene, 2,3-dimethylene-2,3-dihydronaphthalene, 2,3-dimethylene-2,3-dihydrophenanthrene, 2,3-dimethylene-2,3-dihydropyridine, and the like.

It should be noted that cycloaddition reactions may produce products having a variety of substitutions on the fullerene with various n values and a variety of different substitution patterns for each n value when n>1. A blend of such materials does not depart from the scope of the invention and may offer the advantage of enhanced solubility and a reduced propensity for crystallization.

In accordance with the subject matter disclosed herein, the crosslinking agent may be chosen from an epoxy phenolic novolak resin, an epoxy cresylic novolak resin, an epoxy bisphenol A resin, an expoxy bisphenol novolak resin, an alkylolmethyl melamine resin, an alkylolmethyl glycoluril resin, an alkylolmethyl guanamine resin, an alkylomethyl Benzo-Guanamine resin, a glycosyl urea resin, or an isocyanate (alkyd) resin.

Suitable amine-based crosslinkers include the melamines manufactured by Cytec of West Paterson, N.J., such as CYMEL™ 300, 301, 303, 350, 370, 380, 1116 and 1130; benzoguanamine resins such as CYMEL™ 1123 and 1125; the glycoluril resins CYMEL™ 1170, 1171 and 1172; and the urea-based resins, BEETLE™ 60, 65 and 80, also available from Cytec, West Paterson, N.J. A large number of similar amine-based or amidoplast compounds are commercially available from various suppliers. Epoxy phenolic and cresylic novolak resins are shown in (IV), wherein X may be H, $CH_3$ and n may be 0-20. Epoxy bisphenol A resins are shown in an idealized structure (V), wherein n may be 0-20. Epoxy bisphenol Z resins are shown in an idealized structure (VI), wherein n may be 0-20. Similar "epoxy bisphenol" crosslinking agents are contemplated. For example, resins based on the diglycidyl ethers of 1,1-bis(4-hydroxyphenyl)-1-phenyl-ethane, 2,2-bis(4-hydroxyphenyl)hexafluoropropane, 2,2-bis(4-hydroxyphenyl)butane, bis-(4-hydroxyphenyl)diphenylmethane, 2,2-bis(3-methyl-4-hydroxyphenyl)propane, bis(4-hydroxyphenyl)-2,2-dichlorethylene, 1,1-bis(4-hydroxyphenyl)ethane, bis(4-hydroxydiphenyl)methane, 2,2-bis(4-hydroxy-3-isopropyl-phenyl)propane, 1,3-bis(2-(4-hydroxyphenyl)-2-propyl)benzene, bis(4-hydroxyphenyl)sulfone, 1,4-bis(2-(4-hydroxyphenyl)-2-propyl)benzene, 5,5'-(1-methylethyliden)-bis[1,1'-(bisphenyl)-2-ol] propane, 1,1-Bis(4-hydroyphenyl)-3,3,5-trimethylcyclohexane, 4,4'-(9H-fluorene-9,9-diyl)dianiline, and combinations with any of the foregoing may be used.

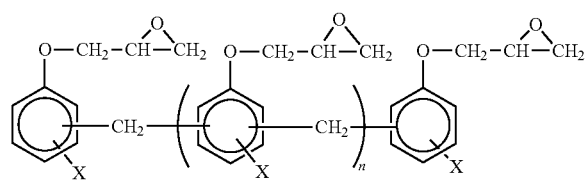

(IV)

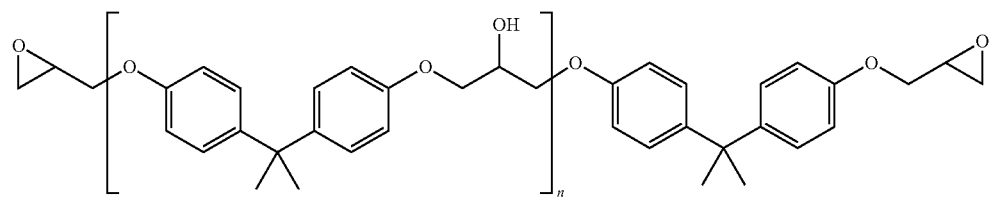

(V)

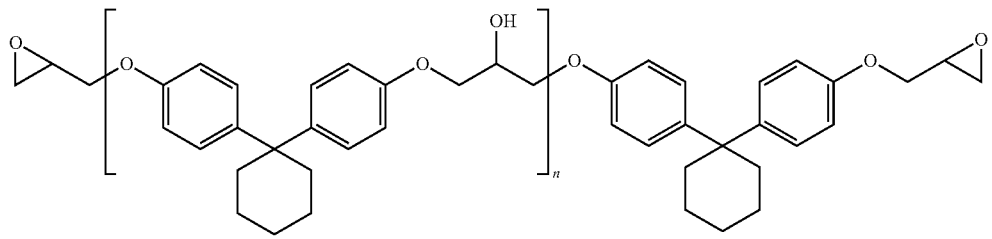
(VI)

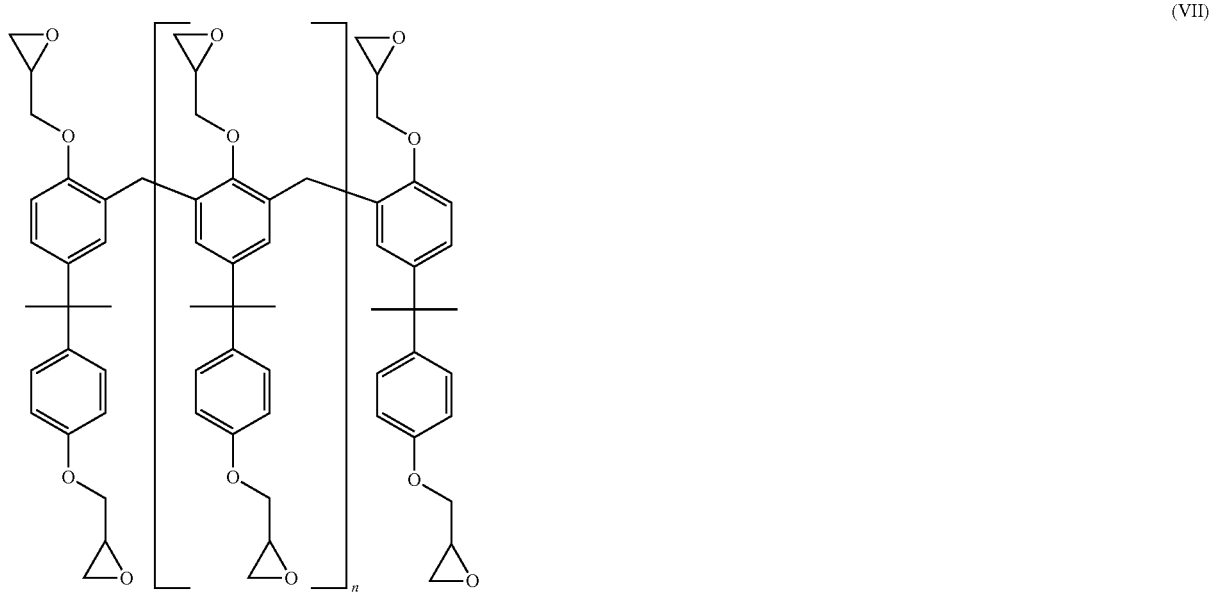
(VII)

In accordance with the subject matter disclosed herein, suitable thermal acid generators may include alkyl esters of organic sulfonic acids, alicyclic esters of organic sulfonic acids, amine salts of organic sulfonic acids, 2-nitrobenzyl esters of organic sulfonic acids, 4-nitrobenzyl esters of organic sulfonic acids, benzoin esters of organic sulfonic acids, β-hydroxyalkyl esters of organic sulfonic acids, β-hydroxycycloalkyl esters of organic sulfonic acids, triaryl sulfonium salts of organic sulfonic acids, alkyl diaryl sulfonium salts of organic sulfonic acids, dialkyl aryl sulfonium salts of organic sulfonic acids, trialkyl sulfonium salts of organic sulfonic acids, diaryl iodonium salts of organic sulfonic acids, alkyl aryl sulfonium salts of organic sulfonic acids, or ammonium salts of tris(organosulfonyl) methides.

Onium salts comprise cations and anions. Exemplary cations of onium salts include triaryl sulfonium, alkyl diaryl sulfonium, dialkyl aryl sulfonium, trialkyl sulfonium, diaryl iodonium, alkyl aryl iodonium, dialkyl iodonium, triaryl selenonium, alkyl diaryl selenonium, dialkyl aryl selenonium, trialkyl selenonium. Without limitation, specific examples of cations in onium salts include triphenyl sulfonium, tri(p-tolyl) sulfonium, 1,4-phenylenebis(diphenylsulfonium) (having a charge of +2), diphenyliodonium, and bis(4-tert-butylphenyl)iodonium.

Further, without limitation, exemplary anions in onium salts include the halides, $PF_6^-$, $AsF_6^-$, $SbF_6^-$, $SbCl_6^-$, and $BF_4^-$. In addition, without limitation, anions based on oxo-acids may be used. Among these are $C_1$-$C_{10}$ perfluoroalkane sulfonates such as trifluoro methane sulfonate, perfluoro butane sulfonate and perfluoro octane sulfonate, $C_1$-$C_{18}$ linear, branched and alicyclic alkane sulfonates, such as dodecane sulfonate, methane sulfonate and camphor sulfonate, $C_1$-$C_{18}$ aromatic and substituted aromatic sulfonates such as toluene sulfonate and dodecylbenzene sulfonate, $C_1$-$C_{18}$ fluorinated aryl sulfonates, such as the trifluoromethyl benzene sulfonates, pentafluoro benzene sulfonate and the like, $C_1$-$C_{18}$ carboxylates and halogenated carboxylates such as benzoate, acetate, chloroacetate, dichloroacetate, trichloroacetate, trifluoroacetate, perfluoropentanoate, pentafluoropropanoate, perfluorooctanoate, perfluorobenzoate, and the like. Further, without limitation, suitable anions include $C_1$-$C_{20}$ tris (alkane sulfonyl)methanides, tris (fluoralkane sulfonyl)methanides, ($R_3C^-$), bis (alkane sulfonyl) imides, and bis (fluoroalkane sulfonyl) imides, ($R_2N^-$), such as tris(trifluoromethylsulfonyl)methanide, bis(trifluoromethylsulfonyl)imide and the like. Further, without limitation, oxo-acid anions can be bound to polymers so that acid diffusion out of the hard-mask material can be limited. Among these are polymeric acids such as poly(vinyl sulfonate), poly(styrene-4-sulfonate), poly(tetrafluoroethylene-co-1,1,2,2-tetrafluoro-2-(1,2,2-trifluorovinyloxy)ethanesulfonate), poly((meth)acrylic acid) and the like. In addition, sulfonated and fluorosulfonated (meth)acrylic monomers may be incorporated into a variety of polymers. It will be appreciated that oxo-acid anions may comprise other elements such as Se, P, As, Sb to form selenonates, phosphonates, arsenonates, stibonates and the like. Thermal acid generators of the ester type may comprise, for example, any of the foregoing oxo-acid anions to form carboxylate, sulfonate, selenonate, phosphonate, arsenonate, and stibonate esters.

Further, without limitation, the ester-type and onium type thermal acid generators may be used as photoacid generators at wavelengths in which they absorb electromagnetic radiation of can act as electron acceptors from other components of the hard-mask composition. In addition, triazine-type photoacid generators may be used. Suitable halogenated triazines include halomethyl-s-triazines. Suitable halogenated triazines include for example, 2-[1-(3,4-benzodioxolyl)]-4,6-bis(trichloromethyl)-1,2,5-tri azine, 2-[1-(2,3-benzodioxolyl)]-4,6-bis(trichloromethyl)-1,3,5-tri azine, 2-[1-(3,4-benzodioxolyl)]-4,6-bis(tribromomethyl)-1,3,5-tria zine, 2-[1-(2,3-benzodioxolyl)]-4,6-bis(tribromomethyl)-1,3,5-tria zine, 2-(2-furfylethylidene)-4,6-bis(trichloromethyl)-1,3,5-triazine, 2-[2-(5-methylfuryl)ethylidene]-4,6-bis(trichloromethyl)-1,3,5-triazine, 2-[2-(4-methylfuryl)ethylidene]-4,6-bis(trichloromethyl)-1,3,5-triazine, 2-[2-(3-methylfuryl)ethylidine]-4,6-bis-(trichloromethyl)-1,3,5-triazine, 2-[2-(4,5-dimethylfuryl)ethylidene]-4,6-bis(trichloromethyl)-1,3,5-triazine, 2-[2-(5-methoxyfuryl)ethylidene]-4,6-bis(trichloromethyl)-1,3,5-triazine, 2-[2-(4-methoxyfuryl)ethylidene]-4,6-bis(trichloromethyl)-1,3,5-triazine, 2-[2-(3-methoxyfuryl)ethylidene]-4,6-bis(trichloromethyl)-1,3,5-triazine, 2-[2-(4,5-dimethoxy-furyl)ethylidene]-4,6-bis(trichloromethyl)-1,3,5-triazine, 2-(2-(2-furfylethylidene)-4,6-bis(tribromomethyl)-1,3,5-tria zine, 2-[2-(5-methylfuryl)ethylidene]-4,6-bis(tribromomethyl)-1,3,5-triazine, 2-[2-(4-methylfuryl)-ethylidene]-4,6-bis(tribromomethyl)-1,3,5-triazine, 2-[2-(3-methylfuryl)ethylidene]-4,6-bis(tribromomethyl)-1,3,5-triazine, 2-[2-(4,5-dimethoxyfuryl)ethylidene]-4,6-bis(tribromomethyl)-1,3,5-triazine, 2-[2-(5-methoxyfuryl)ethylidene]-4,6-bis(tribromomethyl)-1,3,5-triazine, 2-[2-(4-methoxyfuryl)ethylidene]-4,6-bis(tribromomethyl)-1,3,5-triazine, 2-[2-(3-methoxyfuryl)ethylidene]-4,6-bis(tribromomethyl)-1,3,5-triazine, 2-[2-(4,5-dimethoxyfuryl)ethylidene]-4,6-bis(tribromomethyl)-1,3,5-triazine, 2,4,6-tris-(trichloromethyl)-1,3,5-triazine, 2,4,6-tris-(tribromomethyl)-1,3,5-triazine, 2-phenyl-4,6-bis(trichloromethyl)-1,3,5-triazine, 2-phenyl-4,6-bis(tribromomethyl)-1,3,5-triazine, 2-(4-methoxyphenyl)-4,6-bis(trichloromethyl)-1,3,5-triazine, 2-(4-methoxyphenyl)-4,6-bis(tribromomethyl)-1,3,5-triazine, 2-(2-(1-naphthyl)-4,6-bis(trichloromethyl)-1,3,5-triazine, 2-(1-naphthyl)-4,6-bis(tribromomethyl)-1,3,5-triazine, 2-(4-methoxy-1-naphthyl)-4,6-bis(trichloromethyl)-1,3,5-tria zine, 2-(4-methoxy-1-naphthyl)-4,6-bis(tribromomethyl)-1,3,5-triazine, 2-(4-chlorophenyl)-4,6-bis(tribromomethyl)-1,3,5-triazine, 2-styryl-4,6-bis(trichloromethyl)-1,3,5-triazine, 2-styryl-4,6-bis(tribromomethyl)-1,3,5-triazine, 2-(4-methoxystyryl)-4,6-bis(trichloromethyl)-1,3,5-triazine, 2-(4-methoxystyryl)-4,6-bis(tribromomethyl)-1,3,5-triazine, 2-(3,4,5-trimethoxystyryl)-4,6-bis(trichloromethyl)-1,3,5-triazine, 2(3,4,5-trimethoxystyryl)-4,6-bis(trichloromethyl)-1,3,5-tri azine, 2-(3-chloro-1-phenyl)-4,6-bis(trichloromethyl)-1,3,5-triazine, 2-(3-chlorophenyl)-4,6-bis(tribromomethyl)-1,3,5-triazine and the like. Other triazine type photoacid generators useful in the present invention are disclosed in U.S. Pat. No. 5,366,846, herein incorporated by reference.

The s-triazine compounds are condensation reaction products of certain methyl-halomethyl-s-triazines and certain aldehydes or aldehyde derivatives. Such s-triazine compounds may be prepared according to the procedures disclosed in U.S. Pat. No. 3,954,475 and Wakabayashi et al., *Bulletin of the Chemical Society of Japan*, 42, 2924-30 (1969).

In accordance with the subject matter disclosed herein the first solvent may comprise propylene glycol methyl ether acetate, ethyl lactate, anisole, cyclohexanone, toluene, chloroform, chlorobenzene, o-dichloro benzene, m-dichloro benzene, p-dichloro benzene, o-xylene, m-xylene, p-xylene, carbon disulfide, 1-chloronaphthalene, 1-methylnaphthalene, 1,2,4-trimethylbenzene, tetrahydronaphthalene, 1,2,3-tribromopropane, bromoform, cumene, benzene, carbontetrachloride, chloroform, n-hexane, cyclohexane, tetrahydrofuran, acetonitrile, methanol, water, pentane, heptanes, octane, isooctane, decane, dodecane, tetradecane, acetone, isopropanol, dioxane, mesitylene, dichloromethane, or a mixture comprising any of the foregoing.

Alternatively, in accordance with the subject matter disclosed herein the first solvent may comprise anisole, toluene, chloroform, chlorobenzene, o-dichloro benzene, m-dichloro benzene, p-dichloro benzene, o-xylene, m-xylene, p-xylene, carbon disulfide, 1-chloronaphthalene, 1-methylnaphthalene, 1,2,4-trimethylbenzene, tetrahydronaphthalene, 1,2,3-tribromopropane, bromoform, cumene, benzene, carbontetrachloride, chloroform, n-hexane, cyclohexane, tetrahydrofuran, acetonitrile, methanol, water, pentane, heptanes, octane, isooctane, decane, dodecane, tetradecane, mesitylene, dichloromethane, or a mixture comprising any of the foregoing.

In accordance with the subject matter disclosed herein the second solvent or the diluent may comprise an alcohol, an amine, an ester, a lactone, an ether, an ether alcohol, an ether ester, an ester alcohol, a ketone, a ketoester, an aldehyde, a lactone, a lactam, an imide, or a sulfone. The second solvent or diluent may further comprise aromatic solvents or solvents comprising halogen atoms.

In particular, second solvents or diluents may include ethylene glycol monoalkyl ethers, diethylene glycol dialkyl ethers, propylene glycol monoalkyl ethers, propylene glycol dialkyl ethers, alkyl phenyl ethers such as anisole, acetate esters, hydroxyacetate esters, lactate esters, such as ethyl lactate, methyl lactate, propyl lactate, butyl lactate, ethylene glycol monoalkylether acetates, propylene glycol monoalkylether acetates, alkoxyacetate esters, (non-)cyclic ketones, acetoacetate esters, pyruvate esters and propionate esters. Specific examples of these solvents include ethylene glycol monomethyl ether, ethylene glycol monoethyl ether, ethylene glycol monopropyl ether, ethylene glycol monobutyl ether, diethylene glycol dimethyl ether, diethylene glycol diethyl ether, diethylene glycol dipropyl ether, diethylene glycol dibutyl ether, methylcellosolve acetate, ethyl cellosolve acetate, propylene glycol monomethyletheracetate, propylene glycol monoethyletheracetate, propylene glycol monopropyletheracetate, isopropenyl acetate, isopropenyl propionate, methylethyl ketone, cyclohexanone, 2-heptanone, 3-heptanone, 4-heptanone, 2-hydroxypropionate ethyl, 2-hydroxy-2-methylpropionate ethyl, ethoxy acetate ethyl, hydroxyacetate ethyl, 2-hydroxy-3-methyl methylbutyrate, 3-methoxybutylacetate, 3-methyl-3-methoxybutylacetate, 3-methyl-3-methoxybutyl propionate, 3-methyl-3-methoxybutyl butylate, ethyl acetate, propyl acetate, butyl acetate, methyl acetoacetate, ethyl acetoacetate, methyl 3-methoxypropionate, ethyl 3-methoxy propionate, 3-ethoxy propionate methyl and 3-ethoxy propionate ethyl. The aforementioned solvents may be used independently or as a mixture of two or more types. Furthermore, at least one type of high boiling point solvent such as benzylethyl ether, dihexyl ether, diethylene glycol monomethyl ether, diethylene glycol monoethyl ether, acetonylacetone, isoholon, caproic acid, capric acid, 1-octanol, 1-nonanol, benzyl alcohol, benzyl acetate, ethyl benzoate, diethyl oxalate, diethyl maleate, γ-butyrolactone, ethylene carbonate, propylene carbonate and phenylcellosolve acetate may be added to the aforementioned solvent.

In accordance with the subject matter disclosed herein, the total solids in the claimed compositions may suitably comprise 1 g/l to 800 g/l. In accordance with the subject matter disclosed herein total solids in the claimed compositions may further suitably comprise 2.5 g/l to 500 g/l. In accordance with the subject matter disclosed herein total solids in the claimed compositions may still further suitably comprise 5 g/l to 100 g/l.

In accordance with the subject matter disclosed herein, the fullerene loading may suitably comprise 10% to 90% of the total solids in the composition. In accordance with the subject matter disclosed herein, the loading of the crosslinking agent may suitably comprise 90% to 10% of the total solids in the composition. In accordance with the subject matter disclosed herein, the loading of the thermal acid generator may suitably comprise 0% to 40% of the total solids in the composition. In accordance with the subject matter disclosed herein, the photoacid generator may suitably comprise 0% to 40% of the total solids in the composition. All percentages of solids composition are by weight.

Other materials may be present in the composition to enhance film forming characteristics. These include surfactants, wetting agents, rheology modifiers, antifoaming agents and the like.

In accordance with the subject matter disclosed herein, a film formed with any of the described compositions can be heated at a temperature sufficient to cause the crosslinking of the coated film. The presence of a thermal acid generator may lower the temperature at which crosslinking occurs. An exemplary temperature range may be from 80° C. to 350° C. Another exemplary temperature range may be from 100° C. to 250° C. Still another exemplary temperature range may be from 120° C. to 160° C.

In accordance with the subject matter disclosed herein, a film formed with any of the described compositions can be exposed to electromagnetic radiation at an exposure dose sufficient to cause the crosslinking of the coated film either during heating, before heating or at ambient temperature. The presence of a photoacid generator may lower the temperature at which crosslinking occurs. Exemplary exposure wavelengths may be 190 nm to 520 nm, depending on the sensitivity of the photoacid generator. Further exemplary exposure wavelengths may be 225 nm to 400 nm, depending on the sensitivity of the photoacid generator. An exemplary exposure dose range may be from 0.1 mJ/cm$^2$-1000 mJ/cm$^2$. Another exemplary exposure dose range may be 1 mJ/cm$^2$ to 500 mJ/cm$^2$. Still another exemplary exposure dose range may be 10 mJ/cm$^2$ to 100 mJ/cm$^2$.

Without limitation, coating may suitably be accomplished by spray coating, blade coating, spin coating or combinations thereof. With regard to spin coating, for example, spin speeds may suitably range from 100 rpm to 8000 rpm. As a further example, spin speeds may suitably range from 200 rpm to 5000 rpm. As a still further example, spin speeds may range from 800 rpm to 2000 rpm. Spin times may suitably range from 10 sec to 150 sec. Substrates, coated by any of the above methods may suitably be softbaked before crosslinking. Suitable softbake temperatures may range from 50° C. to 150° C.

The following examples are illustrative and are not intended to limit the scope of the appended claims. For example, various substrates, methods of substrate preparation, etch chemistries and conditions, or resist types and exposure conditions may suitably be used.

EXAMPLES

Substrate Preparation:
Silicon (100) substrates (Si-Mat Silicon Materials, n-type) were used for all experimental procedures. Wafers were used as supplied, with no additional cleaning or surface treatment.

Example 1

The following is a synthetic procedure suitable for producing 3,4-bis(bromomethyl)aniline

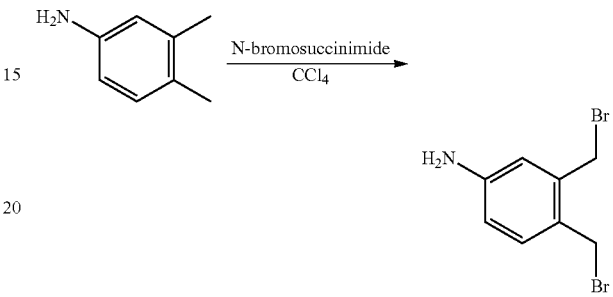

The temperature of an oil bath is raised to 80° C. To a clean dry 250 mL round bottom flask is added a stir bar, 3.03 g (17.0 mmol, 177.98 g/mol, 2.1 eq.) of N-bromosuccinimide (NBS), 0.984 g (8.12 mmol, 121.18 g/mol, 1 eq) of 3,4-dimethylaniline dissolved in 2 mL of carbon tetrachloride, using a dropper, and 12.6 mg of benzoyl peroxide. The flask is fitted with a condenser, capped and then pumped and purged three times with nitrogen and vacuum. Anhydrous carbon tetrachloride (50 mL) is added by syringe and the reaction is placed carefully into the oil bath at 80° C., and allowed to stir at reflux overnight. Succinimide is observed to float on top of the reaction mixture, indicating that the reaction is complete. The carbon tetrachloride is removed by rotary evaporation. Hexane is added, the resulting mixture is sonicated, and the succinimide is removed by filtration. The hexane is then removed by rotary evaporation to give the desired product, 3,4-bis(bromomethyl)aniline as an oil, possibly as a mixture of isomers. This material is used directly in the next reaction without further purification or other manipulation.

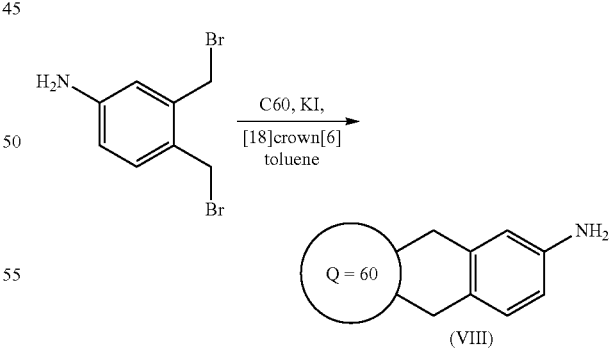

Example 2

The following describes the preparation of the monosubstituted Fullerene adduct (VIII).

The temperature of an oil bath is brought to 130° C. To a clean dry 500 mL 3-necked roundbottom flask containing a stir bar is added 1.334 g (1.85 mmol, 2 eq, 720.64 g/mol) of C60 fullerene, 0.6635 g (3.997 mmol, 4.32 eq, 166.00 g/mol) of potassium iodide, and 3.977 g (15.05 mmol, 16.26 eq, 264.3220 g/mol) of [18]crown[6]. The round bottom flask is fitted with a condenser, and sealed, pumped and purged three times with nitrogen and vacuum. Anhydrous toluene (~330 mL) is added by canulum and the mixture is allowed to reach reflux. 374 mg (0.925 mmol, 1 eq, 404.22 g/mol, 1.312 g/mL) of the dibromide is then added by syringe in anhydrous toluene and the reaction is refluxed and stirred in the dark overnight. After cooling, the reaction mixture is washed with 5% sodium hydroxide solution and water (350 mL), dried with magnesium sulfate, filtered, and toluene is removed by rotary evaporation. The crude material is purified using silica gel chromatography with decalin as the eluent, followed by preparative intermediate pressure liquid chromatography using a column with Cosmosil Buckyprep material as the stationary phase (from Nacalai-Tesque; pyrenylpropyl group bonded silica) and toluene as the mobile phase. Fractions containing pure product were combined and solvent removed using rotary evaporation. The sample is left in an oven overnight at 70° C. under reduced pressure to remove residual solvent. The product is isolated as a brown crystalline solid. Purity is established by HPLC having a column with Cosmosil Buckyprep material as the stationary phase (from NacalaiTesque; pyrenylpropyl group bonded silica) and toluene as the mobile phase. By scaling the reactants of Example 2, it is possible to make multiply substituted products.

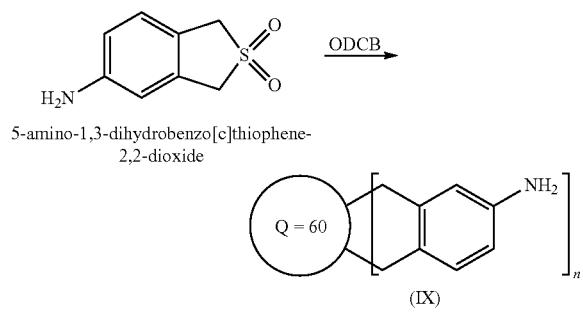

(IX)

Example 3

The following is a preparative procedure for a mixed fullerene (IX) multi substituted amine.

To a clean dry 500 mL 3-necked roundbottom flask containing a stir bar is added 2.0 g (2.78 mmol, 1 eq, 720.64 g/mol) of C60 fullerene, 200 mL of 1-2 dichlorobenzene (ODCB), and 6.11 g (33.4 mmole, 12 eq, 183.23 g/mol) of 5-amino-1,3-dihydrobenzo[c]thiophene-2,2-dioxide. The round bottom flask is fitted with a condenser, and sealed, pumped and purged three times with nitrogen and vacuum. The mixture is brought to reflux and stirred in the dark for 24 hours. After cooling, the reaction mixture is purified over a silica gel bed and the resulting solution of desired product is crystallized and dried in a vacuum oven. The resulting powder is a mixture of substituted fullerene with a typical substitution of n=1 to 8, as shown by MALDI

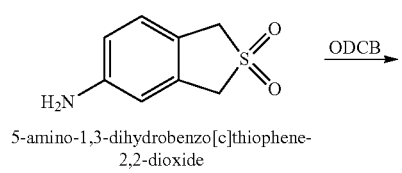

5-amino-1,3-dihydrobenzo[c]thiophene-2,2-dioxide

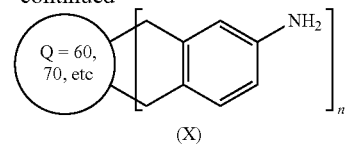

(X)

Example 4

The following is a preparative procedure for a mixed fullerene (IX) multi substituted amine.

Similar to example 3 except that a mixture of dullerenes comprising $C_{60}$ and $C_{70}$ is used with the same weight ratios. The resulting powder is a mixture of mixed substituted mixed fullerene (X). Typical substitution is n=1 to 8, as shown by MALDI.

Example 5

The following describes the formulation and testing of mixed fullerene 10 with a crosslinker.

A formulation of (X) and an epoxy novolac resin CL1201, available from Huntsman Chemical (1:1 ratio w/w) was created in anisole solvent with a solids concentration of 100 g/l. Before use, the formulation was filtered using a 200 nm sized filter. A good quality, uniform film was created when spun at 1500 RPM. After a 3-minute bake on a hotplate in air, at 300° C., the film thickness was measured at 199-202 nm, using a dektak surface profiler. An elution test was performed with the casting solvent (anisole) for 1 minute, and the film thickness was remeasured at 201 nm. The films both before and after elution were of a good quality, with no major imperfections.

Example 6

The following example shows temperature testing of the formulation of Example 5.

As in Example 5 except that the film was baked in a hotplate at 160° C. for 3 min. Elution in the casting solvent as before showed no appreciable change in film thickness.

Example 8

The following shows the solubility of the formulation of Example 5 when it is challenged by a solvent or diluent.

To the formulation of Example 5 (100 μl) was added 900 μl of propylene glycol methyl ether acetate and the solution mixed in a small vial. The resulting solution was a dark brown, non-cloudy mixture, there were no signs of solid precipitants in the vial immediately or after 24 hours.

Comparative Example

The following shows the solubility of similar mixed fullerenes, with no amine substitution in a hardmask formulation.

The Formulation of Example 5 was prepared except that the fullerene derivative used did not have any amine substitution. This formulation was challenged as in Example 7. Immediately, a cloudy light brown mixture formed upon addition of PGMEA and the mixture showed no change after 24 hours.

Although the present invention has been shown and described with reference to particular examples, various changes and modifications which are obvious to persons skilled in the art to which the invention pertains are deemed to lie within the spirit, scope and contemplation of the subject matter set forth in the appended claims.

What is claimed is:

1. A hard-mask composition, comprising:
   (a) a first solute, said first solute comprising one or more fullerene derivatives having one or more exohedral rings, expressed by the general formula:

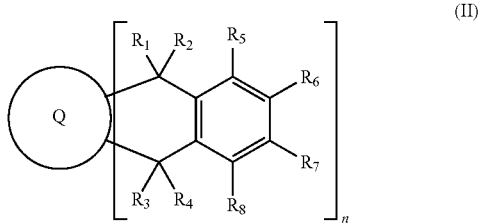

(II)

(b) a second solute comprising a crosslinking agent; said crosslinking agent comprising two or more thermally or catalytically reactive groups;
   (c) a first solvent;
   wherein n is the number of exohedral rings and is an integer from 1 to 12, Q is a fullerene having 60, 70, 76, 78, 80, 82, 84, 86, 90, 92, 94, or 96 carbons atoms; and wherein at least one of $R_6$ or $R_7$ is an amine group, wherein when $R_6$ or $R_7$ is not an amine group, it is a hydrogen or an alkyl group having 1-12 carbon atoms, and wherein the substituent $R_1$-$R_5$ and $R_8$ are each independently hydrogen or an alkyl group having 1-12 carbon atoms, and wherein the one or more fullerene derivatives comprises a blend, said blend comprises species wherein Q=60, and Q=70, n=2 to 8, and wherein a low particulate waste stream is produced when the hard mask composition is provided to a waste stream, wherein the waste stream is a fluid, comprising a second solvent or a diluent, wherein the solvent or diluent in the fluid is the same or different as that in the hard mask composition.

2. The hard-mask composition of claim 1, wherein the amine groups are primary amine groups.

3. The hardmask composition of claim 1 comprising a mixture of fullerene derivatives, characterized by at least one of: a distribution of Q, a distribution of n, or different exohedral rings.

4. The hardmask composition of claim 1, wherein the crosslinking agent is chosen from 4,4'-(9H-fluorene-9,9-diyl)dianiline, an epoxy phenolic novolak resin, an epoxy cresylic novolak resin, an epoxy bisphenol A resin, an epoxy bisphenol A novolak resin, an epoxy bisphenol C resin, poly[(o-cresyl glycidyl ether)-co-formaldehyde], an alkylolmethyl melamine resin, an alkylolmethyl glycoluril resin, an alkylolmethyl guanamine resin, an alkylolmethyl-benzoquanamine resin, a glycosyl urea resin, or an alkyd resin.

5. The hard-mask composition of claim 1, further comprising one or more thermal acid generators, wherein the one or more thermal acid generators are chosen from alkyl esters of organic sulfonic acids, alicyclic esters of organic sulfonic acids, amine salts of organic sulfonic acids, 2-nitrobenzyl esters of organic sulfonic acids, 4-nitrobenzyl esters of organic sulfonic acids, benzoin esters of organic sulfonic acids, β-hydroxyalkyl esters of organic sulfonic acids, β-hydroxycycloalkyl esters of organic sulfonic acids, triaryl sulfonium salts of organic sulfonic acids, alkyl diary l sulfonium salts of organic sulfonic acids, dialkyl aryl sulfonium salts of organic sulfonic acids, trialkyl sulfonium salts of organic sulfonic acids, diaryl iodonium salts of organic sulfonic acids, alkyl aryl sulfonium salts of organic sulfonic acids, or ammonium salts of tris(organosulfonyl) methides.

6. The hardmask composition of claim 1, wherein the first solvent comprises: anisole, toluene, chloroform, chlorobenzene, o-dichloro benzene, m-dichloro benzene, p-dichloro benzene, a-xylene, m-xylene, p-xylene, carbon disulfide, 1-chloronaphthalene, 1-methy naphthalene, 1,2,4-trimethy benzene, tetrahydronaphthalene, 1,2,3-tribromopropane, bromoform, cumene, benzene, carbontetrachloride, chloroform, n-hexane, cyclohexane, pentane, heptane isomers, octane, isooctane, decane, dodecane, tetradecane, mesitylene, dichloromethane, or a mixture comprising any of the foregoing.

* * * * *